(12) United States Patent
Arai et al.

(10) Patent No.: US 10,121,695 B2
(45) Date of Patent: Nov. 6, 2018

(54) SEMICONDUCTOR DEVICE

(71) Applicant: SHINKO ELECTRIC INDUSTRIES CO., LTD., Nagano (JP)

(72) Inventors: Tadashi Arai, Nagano (JP); Yoshikazu Hirabayashi, Nagano (JP); Hidetoshi Arai, Nagano (JP); Tadashi Kodaira, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/852,479

(22) Filed: Dec. 22, 2017

(65) Prior Publication Data
US 2018/0218941 A1    Aug. 2, 2018

(30) Foreign Application Priority Data

Jan. 30, 2017   (JP) .................................. 2017-014613

(51) Int. Cl.
*H01L 23/48* (2006.01)
*H01L 21/768* (2006.01)
*H01L 23/522* (2006.01)
*H05K 3/34* (2006.01)
*H01L 23/12* (2006.01)
*H05K 1/18* (2006.01)
*H05K 3/28* (2006.01)
*H01L 23/532* (2006.01)

(52) U.S. Cl.
CPC .. *H01L 21/76832* (2013.01); *H01L 21/76885* (2013.01); *H01L 23/12* (2013.01); *H01L 23/5226* (2013.01); *H01L 23/53295* (2013.01); *H05K 1/18* (2013.01); *H05K 3/28* (2013.01); *H05K 3/34* (2013.01); *H01L 2224/16225* (2013.01); *H01L 2224/73204* (2013.01); *H01L 2224/81* (2013.01)

(58) Field of Classification Search
CPC ......... H01L 21/76832; H01L 21/76885; H01L 23/12; H01L 23/5226; H01L 23/53295; H05K 1/18; H05K 3/28
See application file for complete search history.

(56) References Cited

U.S. PATENT DOCUMENTS

2017/0047296 A1*   2/2017   Watanabe ............... H01L 24/97

FOREIGN PATENT DOCUMENTS

JP   2016-021482   2/2016

* cited by examiner

*Primary Examiner* — Elias M Ullah
(74) *Attorney, Agent, or Firm* — IPUSA, PLLC

(57) ABSTRACT

A semiconductor device includes a wiring substrate, a semiconductor chip, conductive paste, and an adhesive layer. The wiring substrate includes an insulating layer and a wiring layer on a surface of the insulating layer. The semiconductor chip includes a circuit-formation surface in which an electrode pad is provided, and is mounted on the wiring substrate with the circuit-formation surface facing toward the wiring layer. The conductive paste electrically connects the wiring layer and the electrode pad. The adhesive layer is over the entirety of the surface of the insulating layer, and covers the wiring layer and the conductive paste. The adhesive layer fills in a gap between the surface of the insulating layer and the circuit-formation surface, to bond the wiring substrate and the semiconductor chip. The adhesive layer extends onto a side surface of the semiconductor chip to form a fillet.

13 Claims, 10 Drawing Sheets

SEMICONDUCTOR DEVICE

CROSS-REFERENCE TO RELATED APPLICATION

This application is based upon and claims the benefit of priority of the prior Japanese Patent Application No. 2017-014613, filed on Jan. 30, 2017, the entire contents of which are incorporated herein by reference.

FIELD

A certain aspect of the embodiments discussed herein is related to semiconductor devices.

BACKGROUND

Semiconductor devices including a wiring substrate and a semiconductor chip mounted on the wiring substrate are known. Examples of such semiconductor devices include a semiconductor device where a semiconductor chip is mounted on a wiring substrate that includes an insulating layer, a wiring layer formed on the insulating layer, and a solder resist layer formed on the insulating layer and including an opening that selectively exposes the wiring layer.

According to this semiconductor device, the wiring layer of the wiring substrate and a bump of the semiconductor chip are joined by solder provided in the opening, and an underfill resin fills in where the solder resist layer of the wiring substrate faces the semiconductor chip. (See, for example, Japanese Laid-open Patent Publication No. 2016-021482.)

SUMMARY

According to an aspect of the present invention, a semiconductor device includes a wiring substrate, a semiconductor chip, conductive paste, and an adhesive layer. The wiring substrate includes an insulating layer and a wiring layer on a surface of the insulating layer. The semiconductor chip includes a circuit-formation surface in which an electrode pad is provided, and is mounted on the wiring substrate with the circuit-formation surface facing toward the wiring layer. The conductive paste electrically connects the wiring layer and the electrode pad. The adhesive layer is over the entirety of the surface of the insulating layer, and covers the wiring layer and the conductive paste. The adhesive layer fills in a gap between the surface of the insulating layer and the circuit-formation surface, to bond the wiring substrate and the semiconductor chip. The adhesive layer extends onto a side surface of the semiconductor chip to form a fillet.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
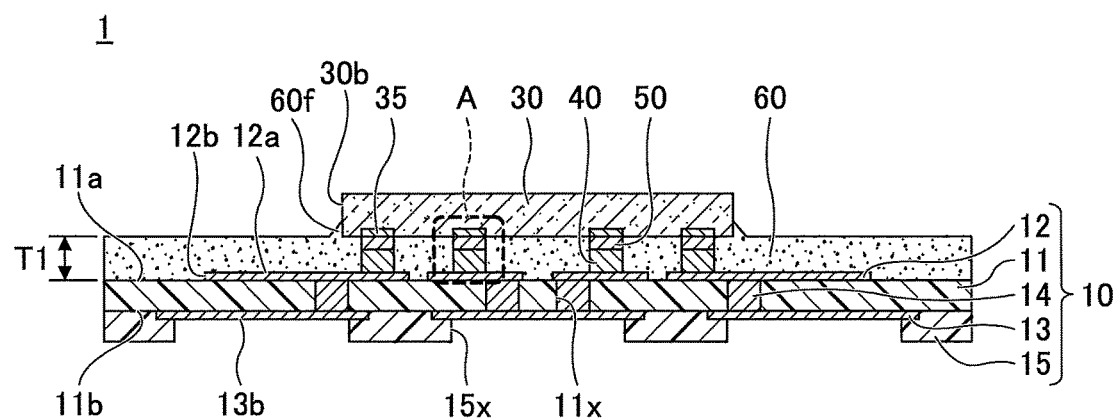
FIGS. 1A and 1B are cross-sectional views of a semiconductor device according to a first embodiment.

According to the semiconductor device as described above, a gap for filling in the underfill resin is required where the solder resist layer of the wiring substrate faces the semiconductor chip, thus causing the problem of an increase in the thickness of the entirety of the semiconductor device.

According to an aspect of the present invention, a semiconductor device reduced in thickness is provided.

Preferred embodiments of the present invention will be explained with reference to accompanying drawings. In the following description, the same elements or components are referred to using the same reference numeral, and a repetitive description thereof may be omitted.

[a] First Embodiment

Figure 1B:
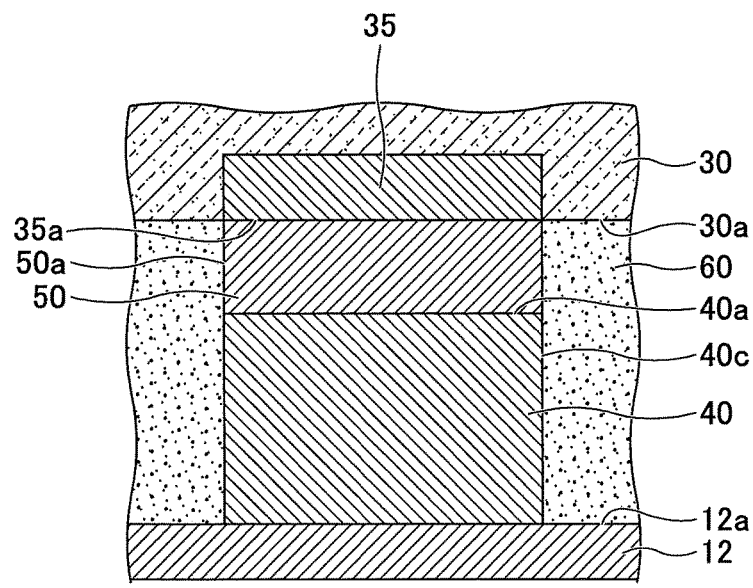

First, a structure of a semiconductor device according to a first embodiment is described. FIG. 1A is a cross-sectional view of the entirety of a semiconductor device according to the first embodiment. FIG. 1B is an enlarged view of part A of FIG. 1A.

Referring to FIGS. 1A and 1B, a semiconductor device 1 according to the first embodiment includes a wiring substrate 10, a semiconductor chip 30, metal pillars 40, electrically conductive paste ("conductive paste") 50, and an adhesive layer 60. The wiring substrate 10 includes an insulating layer 11, a wiring layer 12, a wiring layer 13, through vias 14, and a solder resist layer 15.

According to this embodiment, for convenience of description, the semiconductor chip 30 side of the semiconductor device 1 will be referred to as "upper side" or "first side," and the solder resist layer 15 side of the semiconductor device 1 will be referred to as "lower side" or "second side." Furthermore, with respect to each part or element of the semiconductor device 1, a surface on the semiconductor chip 30 side will be referred to as "upper surface" or "first surface," and a surface on the solder resist layer 15 side will be referred to as "lower surface" or "second surface." The semiconductor device 1, however, may be used in an inverted position or oriented at any angle. Furthermore, a plan view refers to a view of an object taken in a direction normal to an upper surface 11a of the insulating layer 11, and a planar shape refers to the shape of an object viewed in a direction normal to the upper surface 11a of the insulating layer 11.

According to the wiring substrate 10, the insulating layer 11 may be formed of a flexible insulating material such as a polyimide resin, a polyamide resin, or a liquid crystal polymer. Alternatively, a rigid material such as a so-called glass epoxy substrate having glass cloth impregnated with a thermosetting insulating resin such as an epoxy resin may be used as the insulating layer 11. As yet another alternative, a rigid material such as a substrate having a woven or non-woven fabric of glass fibers, carbon fibers, or aramid fibers impregnated with a thermosetting insulating resin such as an epoxy resin or a polyimide resin may be used as the insulating layer 11. The insulating layer 11 may contain a filler such as silica ($SiO_2$). The thickness of the insulating layer 11 may be, for example, approximately 5 μm to approximately 50 μm.

The wiring layer 12 is provided on the upper surface 11a of the insulating layer 11. The wiring layer 13 is provided on a lower surface 11b of the insulating layer 11. The wiring layer 12 and the wiring layer 13 are electrically connected by the through vias 14 filling in through holes 11x piercing through the insulating layer 11. The planar shape of the through vias 14 may be, for example, a circle having a diameter of approximately 60 μm.

Suitable materials for the wiring layers 12 and 13 include, for example, copper (Cu). The thickness of each of the wiring layers 12 and 13 may be, for example, approximately 2 μm to approximately 30 μm. Suitable materials for the through vias 14 include, for example, copper (Cu), gold (Au), and silver (Ag). The wiring layer 12 and the through vias 14 or the wiring layer 13 and the through vias 14 may have a one-piece structure.

The solder resist layer 15 is formed on the lower surface 11b of the insulating layer 11 to cover the wiring layer 13. The solder resist layer 15 includes openings 15x. A lower surface 13b of the wiring layer 13 is partly exposed at the bottom of the openings 15x. The wiring layer 13 exposed at the bottom of the openings 15x serves as pads to be electrically connected to, for example, another wiring substrate, a semiconductor package, or a semiconductor chip. Suitable materials for the solder resist layer 15 include, for example, photosensitive epoxy insulating resins and photosensitive acrylic insulating resins. The thickness of the solder resist layer 15 may be, for example, approximately 10 μm to approximately 30 μm.

The semiconductor chip 30 is mounted on the wiring substrate 10 by flip chip bonding. Specifically, the semiconductor chip 30 includes a circuit-formation surface 30a on which a circuit is formed, and electrode pads 35 are provided in the circuit-formation surface 30a. The semiconductor chip 30 is flip-chip bonded to the wiring substrate 10 with the circuit-formation surface 30a facing toward the wiring layer 12. The metal pillars 40, which are protruding electrodes, are formed on an upper surface 12a of the wiring layer 12. The conductive paste 50, which is thermosetting, is formed on upper end faces 40a of the metal pillars 40. The electrode pads 35 of the semiconductor chip 30 are electrically connected to the wiring layer 12 via the metal pillars 40 and the conductive paste 50. Lower surfaces 35a of the electrode pads 35 may be flush with the circuit-formation surface 30a of the semiconductor chip 30 or may be protruding or depressed relative to the circuit-formation surface 30a of the semiconductor chip 30.

The planar shape of the metal pillars 40 may be, for example, a circle having a diameter of approximately 30 μm. The planar shape of the conductive paste 50 may be, for example, a circle. In this case, the diameter of the conductive paste 50 may be equal to or nearly equal to the diameter of the metal pillars 40. The diameter of the conductive paste 50, however, may also be smaller or greater than the diameter of the metal pillars 40 when it is possible to ensure the connection reliability of the conductive paste 50 and the metal pillars 40. When the conductive paste 50 is greater in diameter than the metal pillars 40, the diameter of the conductive paste 50 may be, for example, approximately 60 μm.

Suitable materials for the metal pillars 40 include, for example, copper (Cu). The height of the metal pillars 40 may be, for example, approximately 5 μm to approximately 45 μm. As the conductive paste 50, for example, copper paste may be used. Other kinds of conductive paste than copper paste, such as silver paste and gold paste, may also be used as the conductive paste 50. The thickness of the conductive paste 50 may be, for example, approximately 5 μm to approximately 45 μm. The conductive paste 50 contains metal powder serving as a principal component dispersed in a resin serving as a binder. As the metal powder, copper powder, silver powder, or gold powder may be suitably used. Alternatively, the metal powder of an alloy of two or more kinds of metal or a mixture of two or more kinds of metal powder may also be used. As the resin to serve as a binder, for example, an epoxy resin or a polyimide resin may be used.

The adhesive layer 60 is provided over the entirety of the upper surface 11a of the insulating layer 11 to cover the upper surface 12a and a side surface 12b of the wiring layer 12, side surfaces 40c of the metal pillars 40, and a side surface 50a of the conductive paste 50. Furthermore, the adhesive layer 60 fills in where the upper surface 11a of the insulating layer 11 faces the circuit-formation surface 30a of the semiconductor chip 30, to bond the wiring substrate 10 and the semiconductor chip 30 together. Moreover, the adhesive layer 60 extends onto a side surface 30b of the semiconductor chip 30 to form a fillet 60f. The fillet 60f may be formed to, for example, surround and cover a lower portion of the side surface 30b of the semiconductor chip 30. Alternatively, the fillet 60f may be formed to surround and cover the entirety of the side surface 30b of the semiconductor chip 30. A thickness T1 of the adhesive layer 60 except for the fillet 60f may be, for example, approximately 12 μm to approximately 80 μm.

That is, the thickness T1 is the interval (distance) between the upper surface 11a of the insulating layer 11 and the circuit-formation surface 30a of the semiconductor chip 30. Compared with conventional semiconductor devices where a solder resist layer and an underfill resin are provided between the upper surface of the insulating layer of a wiring substrate and a semiconductor chip, the thickness T1 can be reduced by approximately 30 μm.

Suitable materials for the adhesive layer 60 include, for example, a photosensitive (thermosetting) insulating resin containing an epoxy resin and a polyimide resin, a non-photosensitive (thermosetting) insulating resin containing an epoxy resin and a polyimide resin, and other photosensitive or non-photosensitive (thermosetting) insulating resins. The material of the adhesive layer 60 may be suitably selected in view of, for example, adhesion to and a difference in the coefficient of thermal expansion from the insulating layer 11.

Next, a method of manufacturing a semiconductor device according to the first embodiment is described. FIGS. 2A through 2F are diagrams illustrating a process of manufacturing a semiconductor device according to the first embodiment. The wiring substrate 10 is manufactured as a multi-region substrate on which multiple regions to become semiconductor devices 1 are provided, and is ultimately divided into individual pieces, so that the individual semiconductor devices 1 are completed. A specific method of manufacturing the semiconductor device 1 is described below.

Figure 2A:
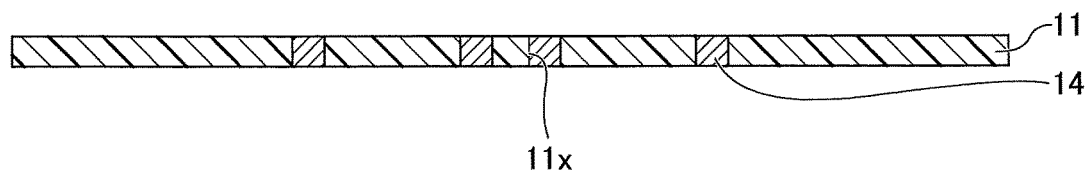
FIGS. 2A through 2F are diagrams illustrating a process of manufacturing a semiconductor device according to the first embodiment.

First, in the process depicted in FIG. 2A, the insulating layer 11 is prepared. The material and the thickness of the insulating layer 11 are as described above. The through holes 11x piercing through the insulating layer 11 are formed by, for example, laser processing. Then, the through holes 11x are filled with conductive paste, using, for example, a dispenser, and the conductive paste is thereafter cured to form the through vias 14. As the conductive paste to fill in the through holes 11x, for example, copper paste, gold paste, or silver paste may be used.

Use of a YAG laser or an excimer laser makes it possible to form the substantially cylindrical through holes 11x having a substantially vertical inner wall surface. When the insulating layer 11 is formed of a photosensitive resin, the through holes 11x may be formed by exposure to light and development. In this case, it is possible to form the substantially cylindrical through holes 11x having a substantially vertical inner wall surface by controlling the power of exposure light.

Figure 2B:
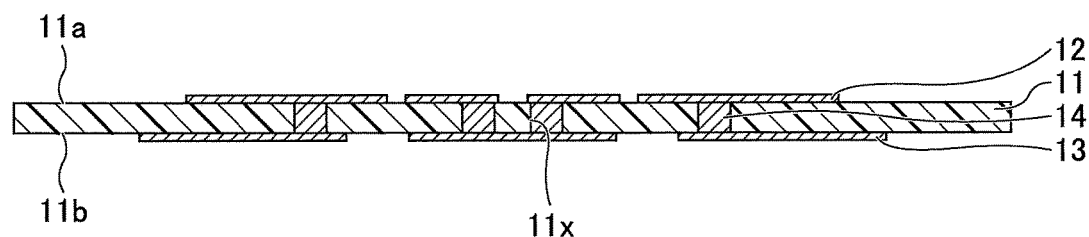

Next, in the process depicted in FIG. 2B, the wiring layer 12 and the wiring layer 13 are formed on the upper surface 11a and the lower surface 11b, respectively, of the insulating layer 11. The wiring layers 12 and 13 are electrically connected by the through vias 14. The wiring layers 12 and 13 may be formed by, for example, a semi-additive process. The material and the thickness of the wiring layers 12 and 13 are as described above.

Figure 2C:
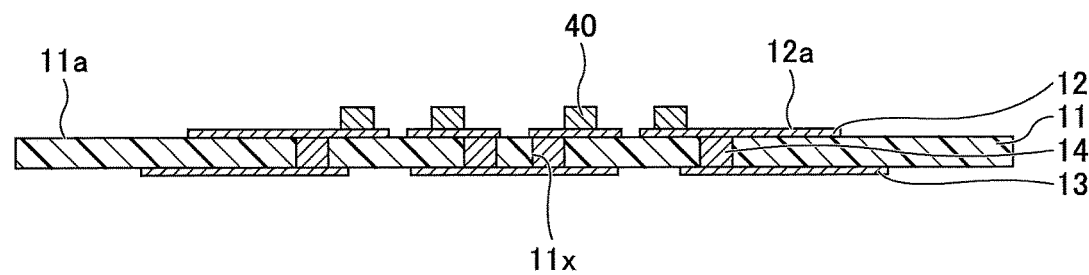

Next, in the process depicted in FIG. 2C, the metal pillars 40 are formed on the upper surface 12a of the wiring layer 12. The metal pillars 40 may be formed by, for example, a semi-additive process. The material and the height of the metal pillars 40 are as described above.

In the case of forming the metal pillars 40 by a semi-additive process, for example, a seed layer is formed on the entirety of each of the upper surface 11a of the insulating layer 11 and the upper surface 12a of the wiring layer 12 by sputtering or electroless plating of copper. Next, a plating resist layer having openings at positions where the metal pillars 40 are to be formed is formed on the seed layer, and the metal pillars 40 are formed on the seed layer exposed in the openings of the plating resist layer by electroplating of copper. Next, the plating resist layer is removed, and the seed layer except for where the metal pillars 40 are formed is removed.

Figure 2D:
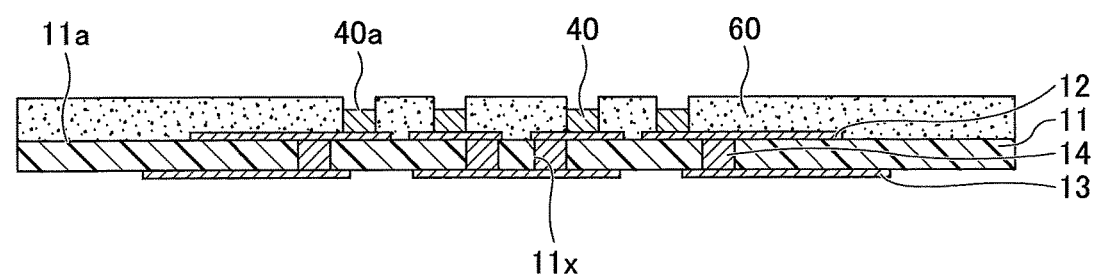

Next, in the process depicted in FIG. 2D, the adhesive layer 60 is formed over the entirety of the upper surface 11a of the insulating layer 11 to cover the wiring layer 12 and expose the upper end faces 40a of the metal pillars 40. Specifically, for example, a laminate of the adhesive layer 60 in B-stage (semi-cured) is provided over the entirety of the upper surface 11a of the insulating layer 11 to cover the wiring layer 12 and the metal pillars 40. Alternatively, the adhesive layer 60 in paste form is applied over the entirety of the upper surface 11a of the insulating layer 11 to cover the wiring layer 12 and the metal pillars 40. Then, the adhesive layer 60 covering the upper end faces 40a of the metal pillars 40 is removed by, for example, exposure to laser light to expose the upper end faces 40a of the metal pillars 40 in the adhesive layer 60. The material and the thickness of the adhesive layer 60 are as described above.

Figure 2E:
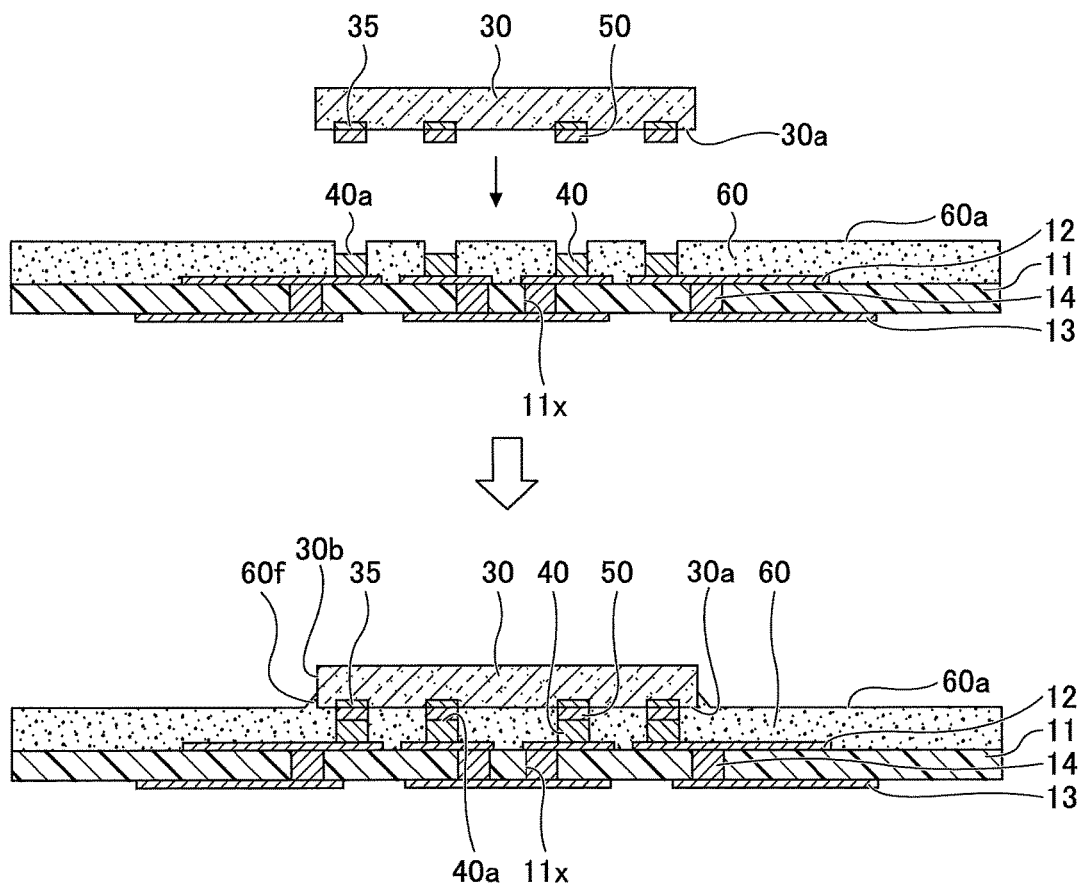

Next, in the process depicted in FIG. 2E, the semiconductor chip 30 having the electrode pads 35 provided in the circuit-formation surface 30a is prepared, and the conductive paste 50 is formed (printed) on the electrode pads 35, using, for example, a dispenser. The material and the thickness of the conductive paste 50 are as described above. Then, the semiconductor chip 30 is placed on the adhesive layer 60 so that the conductive paste 50 contacts the upper end faces 40a of the metal pillars 40 exposed in the adhesive layer 60 and the circuit-formation surface 30a of the semiconductor chip 30 contacts an upper surface 60a of the adhesive layer 60. Thereafter, the conductive paste 50 and the adhesive layer 60 are heated to a predetermined temperature to be cured while pressing the semiconductor chip 30 against the adhesive layer 60.

As a result, the adhesive layer 60 fills in a gap across which the upper surface 11a of the insulating layer 11 faces the circuit-formation surface 30a of the semiconductor chip 30, to bond the wiring substrate 10 and the semiconductor chip 30 together. Furthermore, the adhesive layer 60 extends onto the side surface 30b of the semiconductor chip 30 to form the fillet 60f. The electrode pads 35 of the semiconductor chip 30 are electrically connected to the metal pillars 40 via the conductive paste 50. The fillet 60f, which may be formed to, for example, surround and cover a lower portion of the side surface 30b of the semiconductor chip 30, may alternatively be formed to surround and cover the entirety of the side surface 30b of the semiconductor chip 30.

The predetermined temperature for curing the conductive paste 50 and the adhesive layer 60 is, for example, approximately 180° C. This temperature is lower than the melting temperature of solder (for example, approximately 220° C.) in the case of using solder instead of the conductive paste 50. Therefore, it is possible to reduce the deflection of the wiring substrate 10.

Figure 2F:
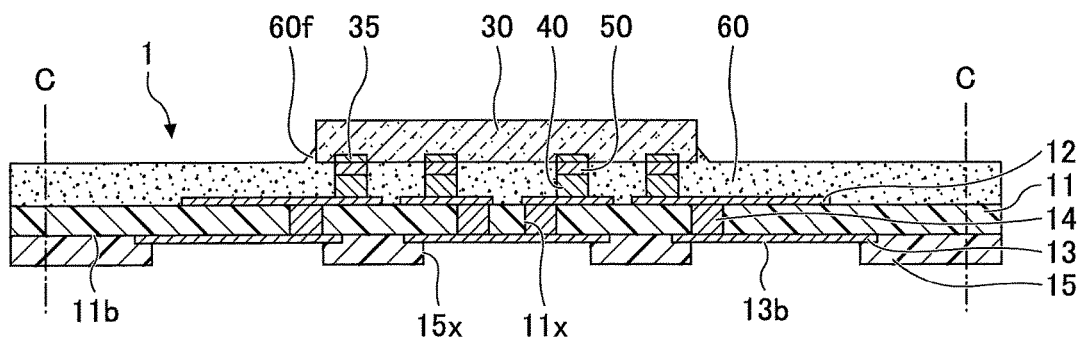

Next, in the process depicted in FIG. 2F, the solder resist layer 15 is formed on the lower surface 11b of the insulating layer 11 to cover the wiring layer 13. To form the solder resist layer 15, for example, a photosensitive epoxy insulating resin or a photosensitive acrylic insulating resin in liquid or paste form may be applied on the lower surface 11b of the insulating layer 11 to cover the wiring layer 13 by, for example, screen printing, roll coating, or spin coating. Alternatively, for example, a laminate of a photosensitive epoxy insulating resin or a photosensitive acrylic insulating resin in film form may be provided on the lower surface 11b of the insulating layer 11 to cover the wiring layer 13.

The applied insulating resin or the laminate of insulating resin is exposed to light and developed to form the openings 15x (photolithography). As a result, the solder resist layer 15 having the openings 15x is formed, and the lower surface 13b of the wiring layer 13 is partly exposed at the bottom of the openings 15x. Alternatively, a laminate of an insulating resin in film form in which the openings 15x are preformed may be provided on the lower surface 11b of the insulating layer 11 to cover the wiring layer 13.

After the process depicted in FIG. 2F, the structure depicted in FIG. 2F is cut at cutting positions C into individual semiconductor devices 1, using, for example, a slicer. As a result, the semiconductor device 1 as depicted in FIGS. 1A and 1B is completed.

Figure 3:
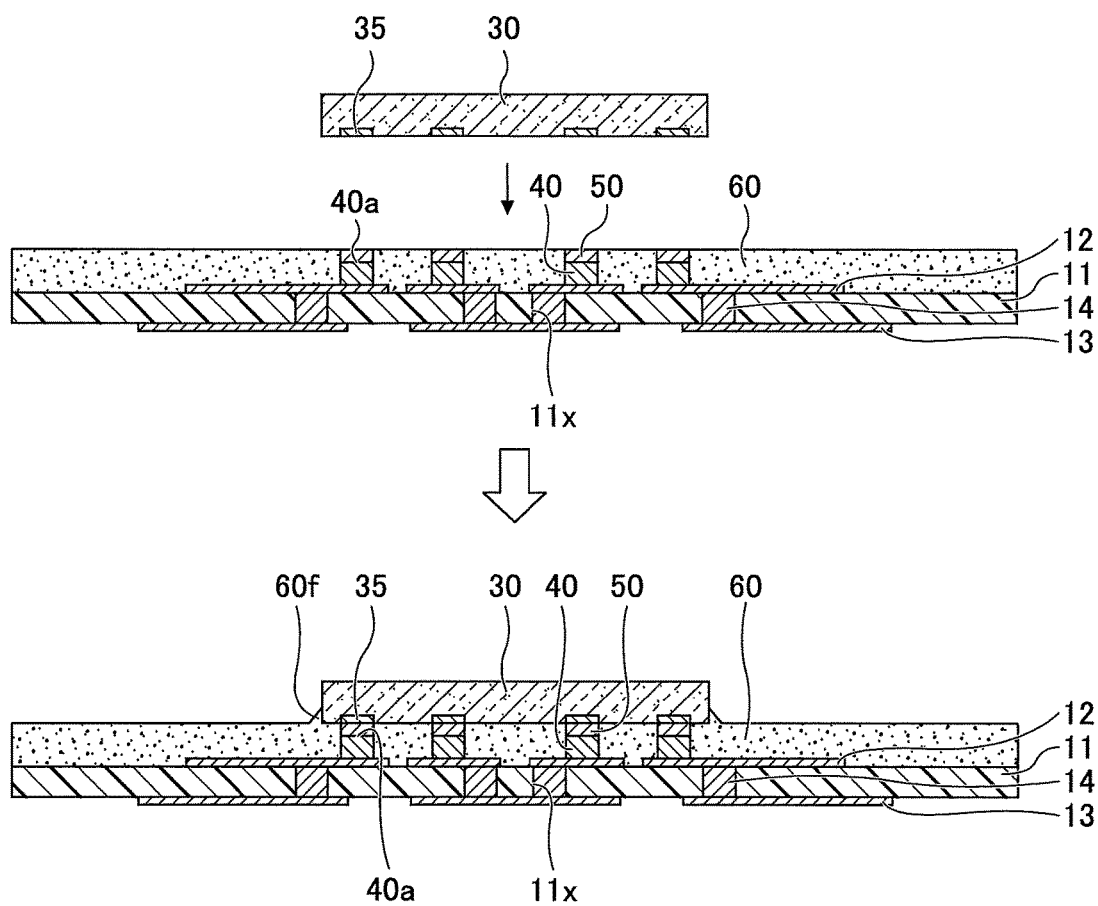
FIG. 3 is a diagram illustrating a process of manufacturing a semiconductor device according to the first embodiment.

Instead of executing the process depicted in FIG. 2E, the conductive paste 50 may be formed on the upper end faces 40a of the metal pillars 40 exposed in the adhesive layer 60, and the semiconductor chip 30 may thereafter be mounted as illustrated in FIG. 3. In addition, the formation of the solder resist layer 15 as depicted in FIG. 2F may alternatively be performed immediately after the process depicted in FIG. 2C or the process depicted in FIG. 2D.

Thus, according to the semiconductor device 1, the adhesive layer 60 provided over the entirety of the upper surface 11a of the insulating layer 11 covers the wiring layer 12 and the conductive paste 50, and fills in where the upper surface 11a of the insulating layer 11 faces the circuit-formation surface 30a of the semiconductor chip 30, to bond the wiring substrate 10 and the semiconductor chip 30 together. That is, unlike conventional semiconductor devices, a solder resist layer and an underfill resin are not provided between the upper surface 11a of the insulating layer 11 of the wiring substrate 10 and the semiconductor chip 30. Accordingly, it is possible to reduce the thickness of the whole semiconductor device 1.

Furthermore, the adhesive layer 60 extends onto at least part of the side surface 30b of the semiconductor chip 30 to form the fillet 60f. Therefore, it is possible to increase, for example, the moisture resistance of the semiconductor chip 30.

[First Variation of First Embodiment]

According to a first variation of the first embodiment, the through vias 14 are formed by a method different from that of the first embodiment. In the description of the first variation, a description of the same elements or components as those of the first embodiment described above may be omitted.

Figure 4A:
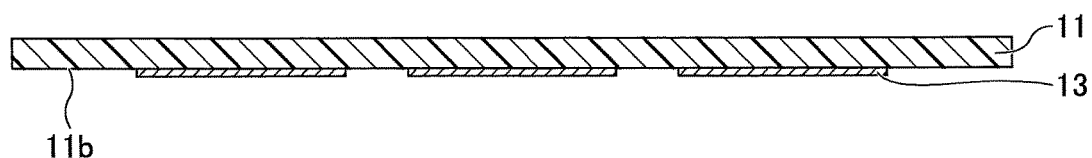
FIGS. 4A through 4C are diagrams illustrating a method of manufacturing a semiconductor device according to a first variation of the first embodiment.
Figure 4B:
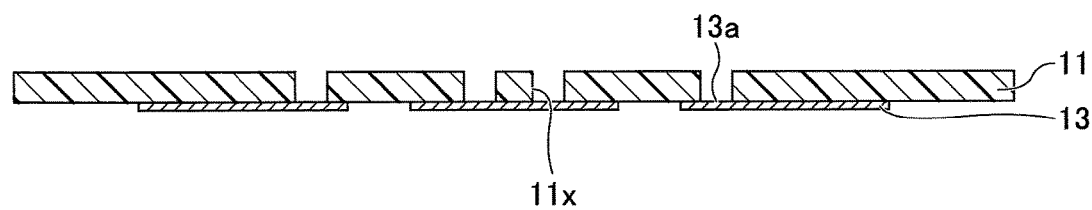
Figure 4C:
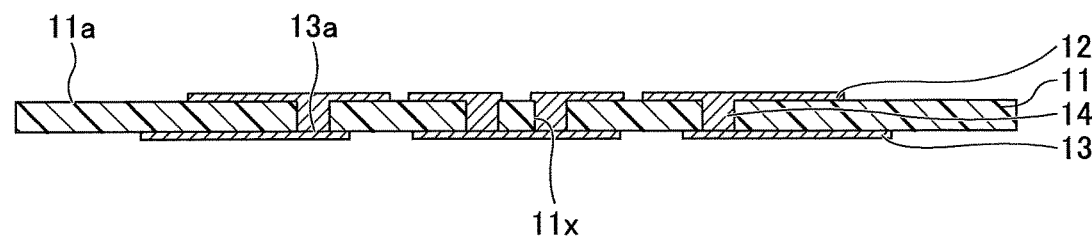

FIGS. 4A through 4C are diagrams illustrating a process of manufacturing a semiconductor device according to the first variation. The processes depicted in FIGS. 4A through 4C may be executed instead of the processes depicted in FIGS. 2A and 2B of the first embodiment.

First, in the process depicted in FIG. 4A, the insulating layer 11 is prepared, and the wiring layer 13 is formed on the lower surface 11b of the insulating layer 11. The wiring layer 13 may be formed by, for example, a semi-additive process. The material and the thickness of the wiring layer 13 are as described above.

Next, in the process depicted in FIG. 4B, the through holes 11x piercing through the insulating layer 11 are formed by, for example, laser processing. An upper surface 13a of the wiring layer 13 is exposed in the through holes 11x. When the insulating layer 11 is formed of a photosensitive resin, the through holes 11x may be formed by exposure to light and development. The shape of the through holes 11x may be controlled as described above.

Next, in the process depicted in FIG. 4C, the through vias 14 are formed in the through holes 11x, and the wiring layer 12 is formed on the upper surface 11a of the insulating layer 11. The through vias 14 and the wiring layer 12 may be formed by, for example, a semi-additive process.

Specifically, a seed layer is formed of copper or the like to continuously cover the upper surface 11a of the insulating layer 11, the inner wall surfaces of the through holes 11x, and the upper surface 13a of the wiring layer 13 exposed in the through holes 11x. The seed layer may be formed by, for example, sputtering or electroless plating. Next, a resist layer having openings that expose the through holes 11x and regions where the wiring layer 12 is to be formed is formed, and copper or the like is deposited in the through holes 11x and the openings to form an electroplating layer by electroplating, using the seed layer as a power feed layer. After removal of the resist layer, the seed layer not covered with the electroplating layer is removed by etching. As a result, the through vias 14 and the wiring layer 12 are formed. According to this method, the through vias 14 and the wiring layer 12 are formed of the same material as a one-piece structure.

Alternatively, the wiring layer 12 may be formed first, and the through vias 14 and the wiring layer 13 may be thereafter formed in the same manner as described above. In this case, the through vias 14 and the wiring layer 13 are formed of the same material as a one-piece structure.

After the process depicted in FIG. 4C, the process of FIG. 2C and the subsequent processes of the first embodiment are executed to complete the semiconductor device 1 as depicted in FIGS. 1A and 1B.

Thus, the through vias 14 may be formed by filling in conductive paste or formed by, for example, plating.

[Second Variation of First Embodiment]

According to a second variation of the first embodiment, the shape of conductive paste that connects a wiring substrate and a semiconductor chip is different from that of the first embodiment. In the description of the second variation, a description of the same elements or components as those of the first embodiment described above may be omitted.

Figure 5A:
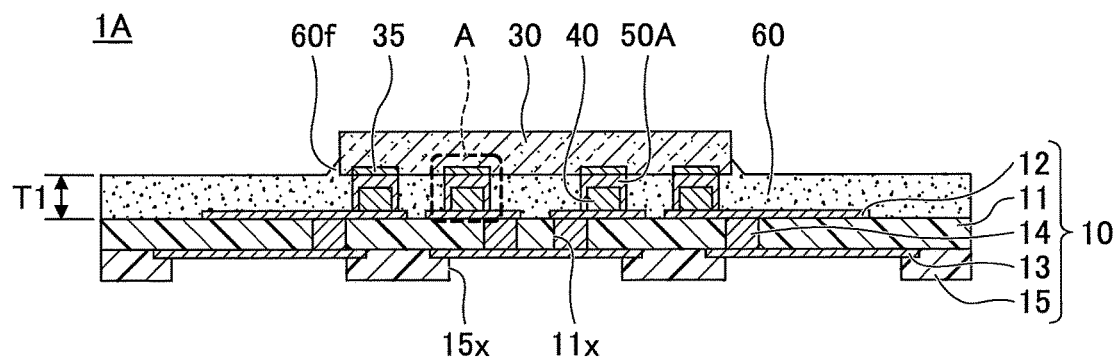
FIGS. 5A and 5B are cross-sectional views of a semiconductor device according to a second variation of the first embodiment.
Figure 5B:
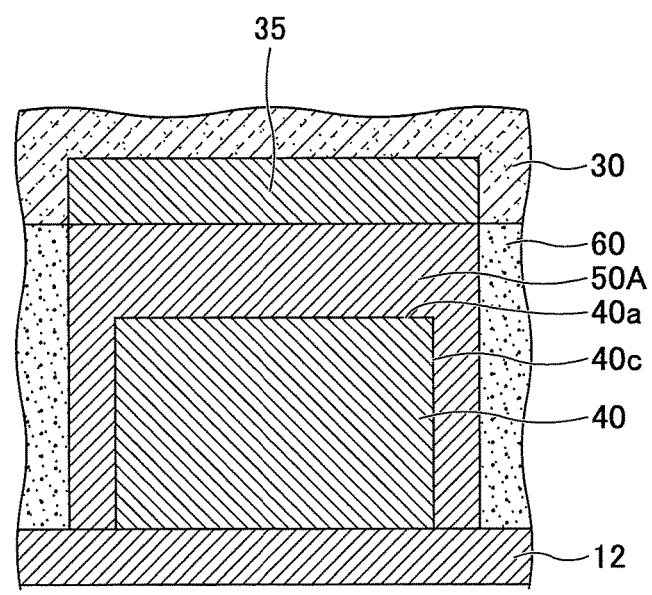

FIG. 5A is a cross-sectional view of the entirety of a semiconductor device according to the second variation. FIG. 5B is an enlarged view of part A of FIG. 5A.

Referring to FIGS. 5A and 5B, a semiconductor device 1A according to the second variation is different from the semiconductor device 1 (FIGS. 1A and 1B) of the first embodiment in that the conductive paste 50 is replaced with conductive paste 50A. The conductive paste 50A is formed to cover the entirety of the upper end face 40a and the entirety of the side surface 40c of each metal pillar 40 (hereinafter, "the metal pillar 40").

In the process depicted in FIG. 2E of the first embodiment, the amount of printing of the conductive paste 50A on the electrode pads 35 of the semiconductor chip 30 and the amount of pressing the semiconductor chip 30 against the adhesive layer 60 when curing the conductive paste 50A and the adhesive layer 60 can be suitably controlled. By controlling the amount of printing of the conductive paste 50A and the amount of pressing the semiconductor chip 30 against the adhesive layer 60, part of the conductive paste 50A extends from the upper end face 40a onto the side surface 40c of the metal pillar 40 to enter the interface between the metal pillar 40 and the adhesive layer 60. As a result, as depicted in FIGS. 5A and 5B, the conductive paste 50A can be formed to cover the entirety of the upper end face 40a and the entirety of the side surface 40c of the metal pillar 40.

The conductive paste 50A may alternatively be formed to cover the entirety of the upper end face 40a and part (an upper portion) of the side surface 40c of the metal pillar 40. That is, it is possible that part (a lower portion) of the side surface 40c of the metal pillar 40 is not covered with the conductive paste 50A to be exposed. The material of the conductive paste 50A and the thickness of the conductive paste 50A on the upper end face 40a of the metal pillar 40 may be, for example, the same as those of the conductive paste 50 of the first embodiment.

Thus, the conductive paste 50A may be formed to cover the entirety of the upper end face 40a and at least part of the side surface 40c of the metal pillar 40. As a result, the contact area of the metal pillar 40 and the conductive paste 50A increases. Therefore, it is possible to improve the connection reliability of the metal pillar 40 and the conductive paste 50A.

[b] Second Embodiment

According to a second embodiment, the position of conductive paste that connects a wiring substrate and a semiconductor chip is different from that in the first embodiment. In the description of the second embodiment, a description of the same elements or components as those of the first embodiment described above may be omitted.

Figure 6A:
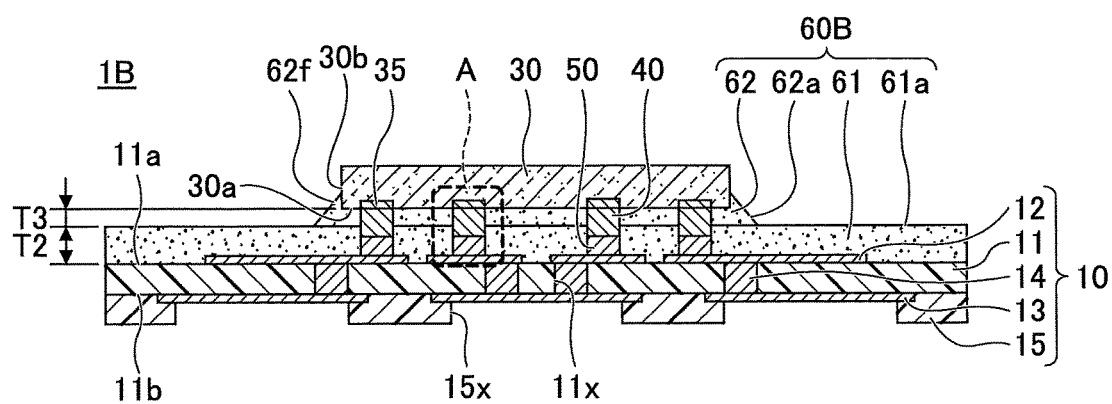
FIGS. 6A and 6B are cross-sectional views of a semiconductor device according to a second embodiment.
Figure 6B:
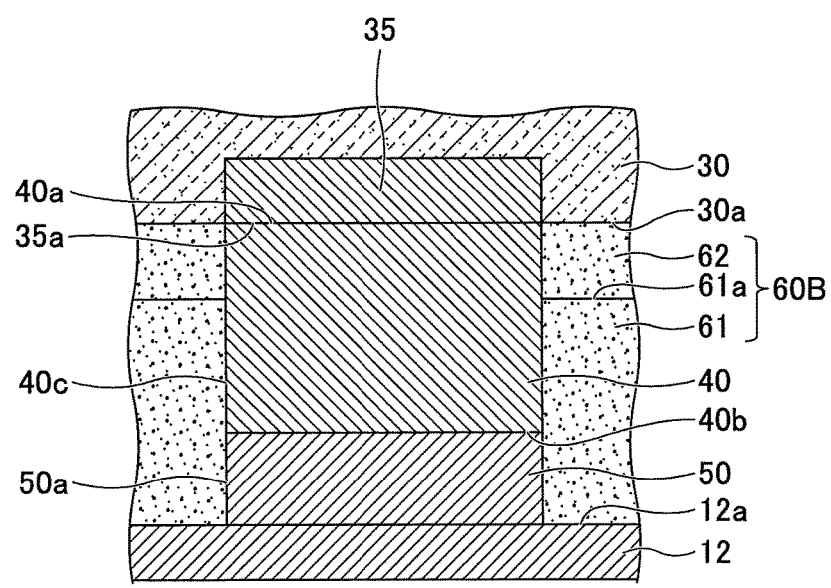

First, a structure of a semiconductor device according to the second embodiment is described. FIG. 6A is a cross-sectional view of the entirety of a semiconductor device according to the second embodiment. FIG. 6B is an enlarged view of part A of FIG. 6A.

Referring to FIGS. 6A and 6B, a semiconductor device 1B according to the second embodiment is different from the semiconductor device 1 (FIGS. 1A and 1B) of the first embodiment in, for example, that the vertical positions of the metal pillars 40 and the conductive paste 50 are interchanged and that an adhesive layer 60B is a laminate (layered structure) of a first adhesive layer 61 and a second adhesive layer 62.

According to the semiconductor device 1B, the metal pillars 40 are formed on the electrode pads 35 of the semiconductor chip 30, and lower end faces 40b of the metal pillars 40 are electrically connected to the wiring layer 12 of the wiring substrate 10 via the conductive paste 50. The material and the height of the metal pillars 40 may be, for example, the same as in the first embodiment. The material and the thickness of the conductive paste 50 may be, for example, the same as in the first embodiment.

The first adhesive layer 61 is provided over the entirety of the insulating layer 11 to cover the wiring layer 12, and forms a gap between an upper surface 61a of the first adhesive layer 61 and the circuit-formation surface 30a of the semiconductor chip 30. The second adhesive layer 62 is layered on part of the upper surface 61a of the first adhesive layer 61 to fill in the gap between the upper surface 61a of the first adhesive layer 61 and the circuit-formation surface 30a of the semiconductor chip 30.

The first adhesive layer 61 and the second adhesive layer 62 are formed of the same material as one piece. For example, the same insulating resin as used for the adhesive layer 60 may be used for the first adhesive layer 61 and the second adhesive layer 62. A thickness T2 of the first adhesive layer 61 may be, for example, approximately 7 μm to approximately 50 μm. A thickness T3 of the second adhesive layer 62 except for a fillet 62f may be, for example, approximately 5 μm to approximately 30 μm.

The first adhesive layer 61 covers the entirety of the side surface 50a of the conductive paste 50 and a lower portion of the side surface 40c of each metal pillar 40. The second adhesive layer 62 covers an upper portion of the side surface 40c of each metal pillar 40. The second adhesive layer 62 gradually becomes wider toward the first adhesive layer 61 to have an inclined side surface 62a. The second adhesive layer 62 extends onto the side surface 30b of the semiconductor chip 30 to form the fillet 62f. The fillet 62f may be formed to, for example, surround and cover a lower portion of the side surface 30b of the semiconductor chip 30. Alternatively, the fillet 62f may be formed to surround and cover the entirety of the side surface 30b of the semiconductor chip 30.

Figure 7A:
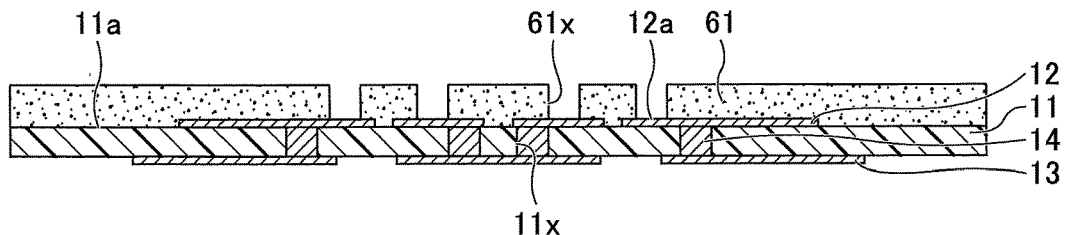
FIGS. 7A through 7C are diagrams illustrating a process of manufacturing a semiconductor device according to the second embodiment.
Figure 7B:
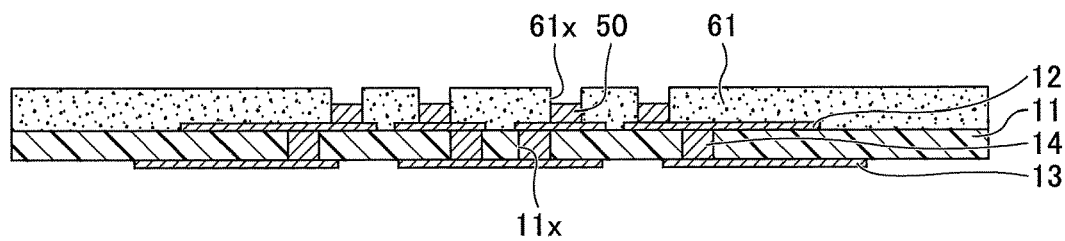
Figure 7C:
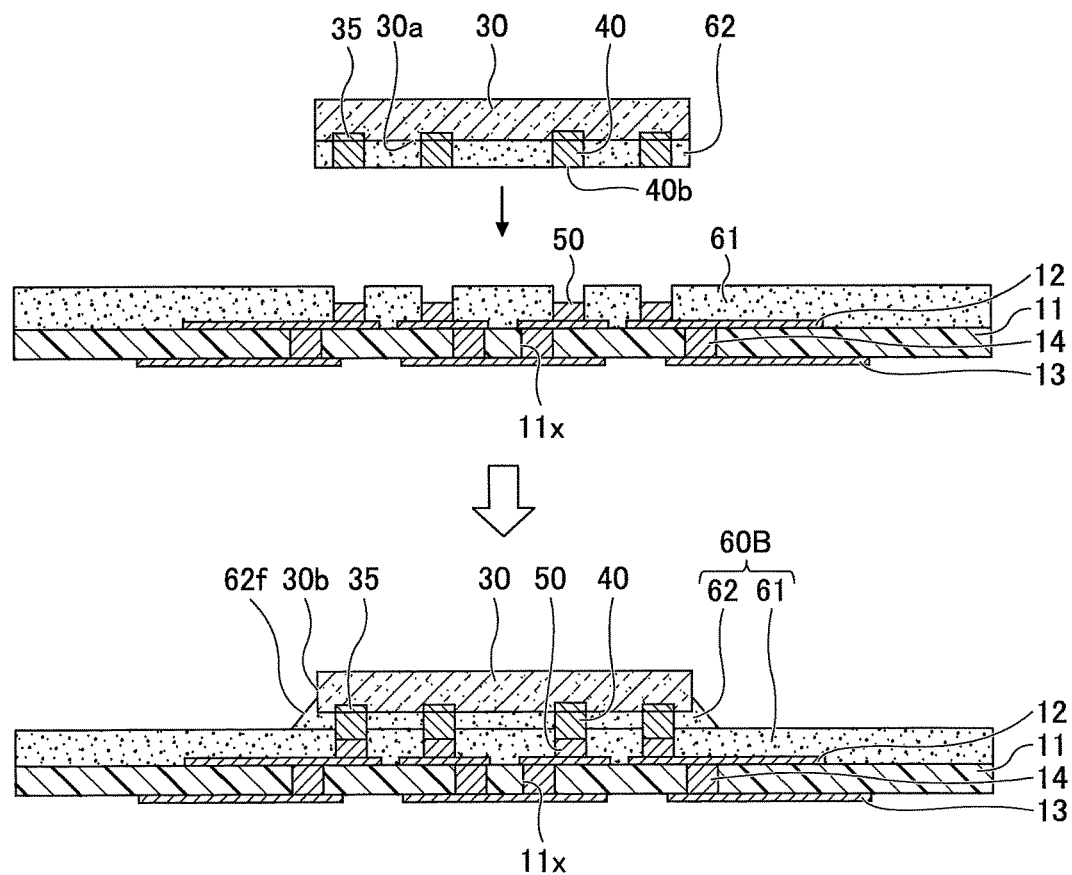

Next, a method of manufacturing a semiconductor device according to the second embodiment is described. FIGS. 7A through 7C are diagrams illustrating a process of manufacturing a semiconductor device according to the second embodiment.

First, the processes depicted in FIGS. 2A and 2B of the first embodiment are executed. Then, in the process depicted in FIG. 7A, the first adhesive layer 61 in B-stage (semi-cured) is formed over the entirety of the upper surface 11a of the insulating layer 11 to cover the wiring layer 12. Alternatively, the first adhesive layer 61 in paste form is applied over the entirety of the upper surface 11a of the insulating layer 11 to cover the wiring layer 12. Then, part of the first adhesive layer 61 where the conductive paste 50 is to be formed is removed to form openings 61x that selectively expose the upper surface 12a of the wiring layer 12 in the first adhesive layer 61. The openings 61x may be formed by, for example, laser processing. The material and the thickness of the first adhesive layer 61 are as described above. When the first adhesive layer 61 is formed of a photosensitive resin, the openings 61x may be formed by exposure to light and development. The shape of the openings 61x may be controlled the same as in the case of the through holes 11x.

Next, in the process depicted in FIG. 7B, the openings 61x are filled with the conductive paste 50, using, for example, a dispenser. The conductive paste 50 may be formed to fill in at least part of each opening 61x.

Next, in the process depicted in FIG. 7C, the semiconductor chip 30 having the electrode pads 35 provided in the circuit-formation surface 30a is prepared, and the metal pillars 40 are formed on the electrode pads 35. Then, the second adhesive layer 62 in B-stage (semi-cured) is formed over the circuit-formation surface 30a of the semiconductor chip 30 to cover the metal pillars 40. Alternatively, the second adhesive layer 62 in paste form is applied over the circuit-formation surface 30a of the semiconductor chip 30 to cover the metal pillars 40. Then, the second adhesive layer 62 covering the lower end faces 40b of the metal pillars 40 is removed to expose the lower end faces 40b in the second adhesive layer 62. The second adhesive layer 62 covering the lower end faces 40b of the metal pillars 40 may be removed by, for example, exposure to laser light. The material and the thickness of the second adhesive layer 62 are as described above.

Then, the semiconductor chip 30 is placed over the first adhesive layer 61 so that the lower end faces 40b of the metal pillars 40 contact the conductive paste 50 and the second adhesive layer 62 contacts the first adhesive layer 61. Thereafter, the conductive paste 50, the first adhesive layer 61, and the second adhesive layer 62 are cured while pressing the semiconductor chip 30 toward the first adhesive layer 61.

As a result, the adhesive layer 60B into which the first adhesive layer 61 and the second adhesive layer 62 are combined as one piece is formed. The adhesive layer 60B fills in a gap across which the upper surface 11a of the insulating layer 11 faces the circuit-formation surface 30a of the semiconductor chip 30, to bond the wiring substrate 10 and the semiconductor chip 30 together. Furthermore, the second adhesive layer 62 of the adhesive layer 60B extends onto the side surface 30b of the semiconductor chip 30 to form the fillet 62f. The metal pillars 40 are electrically connected to the wiring layer 12 via the conductive paste 50. The fillet 62f, which may be formed to, for example, surround and cover a lower portion of the side surface 30b of the semiconductor chip 30, may alternatively be formed to surround and cover the entirety of the side surface 30b of the semiconductor chip 30.

Figure 8:
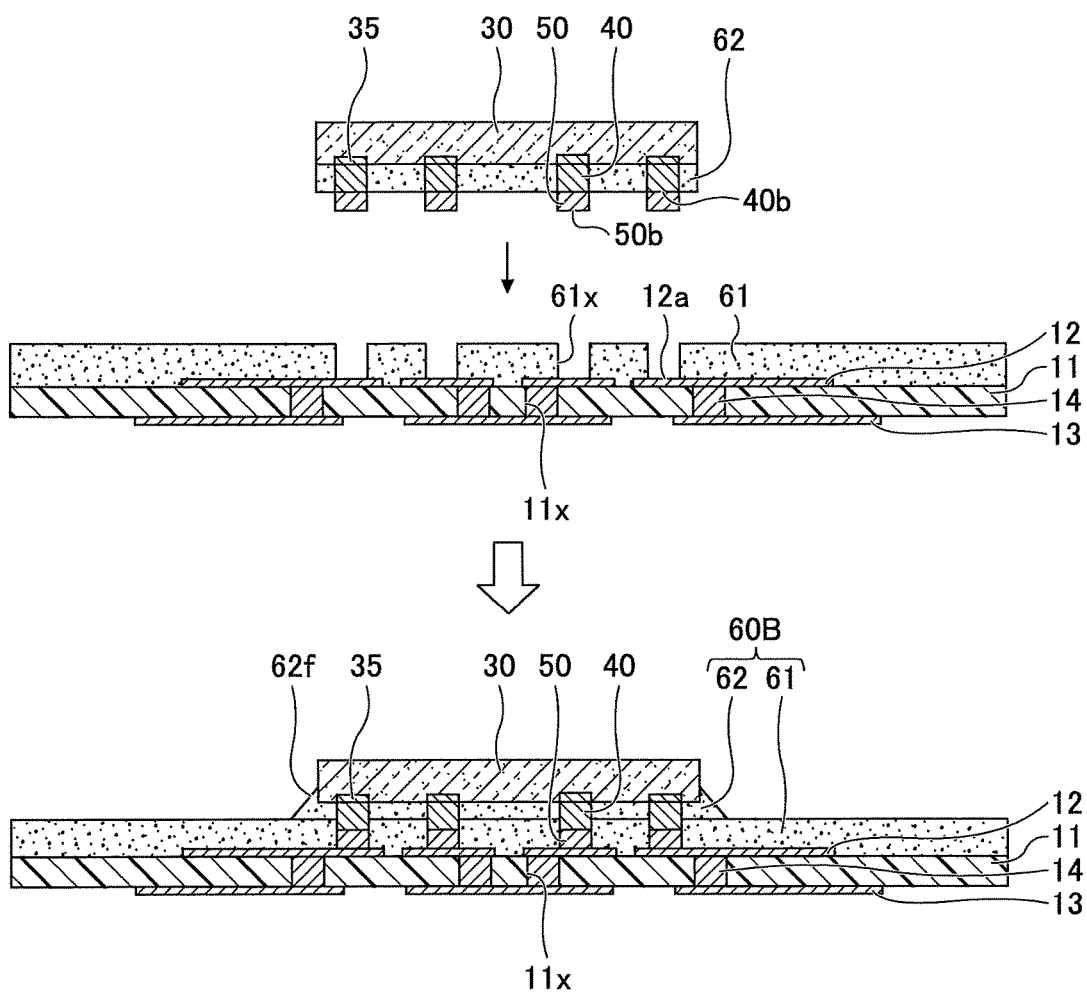
FIG. 8 is a diagram illustrating a process of manufacturing a semiconductor device according to the second embodiment.

Instead of executing the process depicted in FIG. 7C, the conductive paste 50 may be printed on the lower end faces 40b of the metal pillars 40 exposed in the second adhesive layer 62 as illustrated in FIG. 8. In this case, the semiconductor chip 30 is placed over the first adhesive layer 61 so that a lower end face 50b of the conductive paste 50 contacts the upper surface 12a of the wiring layer 12 exposed in the openings 61x of the first adhesive layer 61. Then, the conductive paste 50, the first adhesive layer 61, and the second adhesive layer 62 are cured while pressing the semiconductor chip 30 toward the first adhesive layer 61.

Thus, the metal pillars 40 may be formed on the electrode pads 35 of the semiconductor chip 30 to be electrically connected to the wiring layer 12 via the conductive paste 50 formed on the lower end faces 40b of the metal pillars 40. Furthermore, the first adhesive layer 61 and the second adhesive layer 62 may be provided on the wiring substrate 10 and the semiconductor chip 30, respectively, to be combined as one piece to form the adhesive layer 60B. In this case as well, the same effects as in the first embodiment are produced.

[Variation of Second Embodiment]

According to a variation of the second embodiment, the shape of conductive paste that connects a wiring substrate and a semiconductor chip is different from that of the second embodiment. In the description of the variation, a description of the same elements or components as those of the second embodiment described above may be omitted.

Figure 9A:
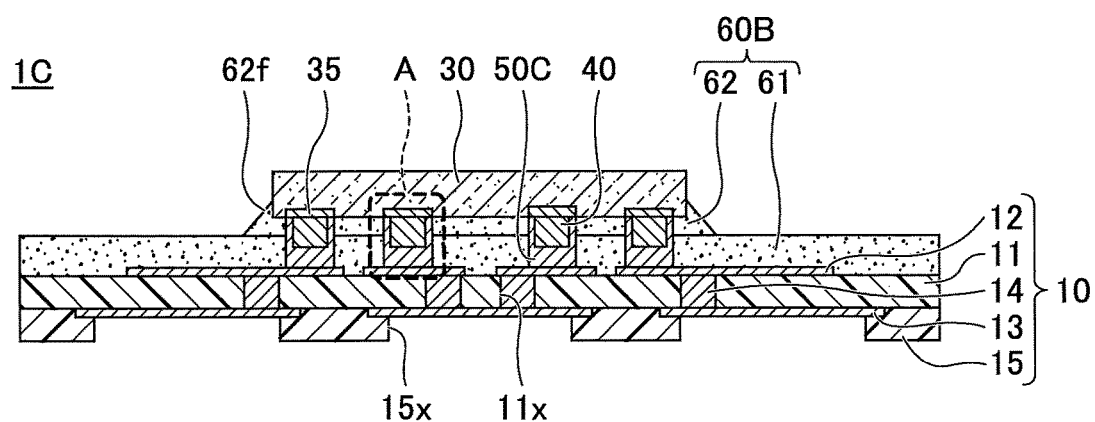
FIGS. 9A and 9B are cross-sectional views of a semiconductor device according to a variation of the second embodiment.
Figure 9B:
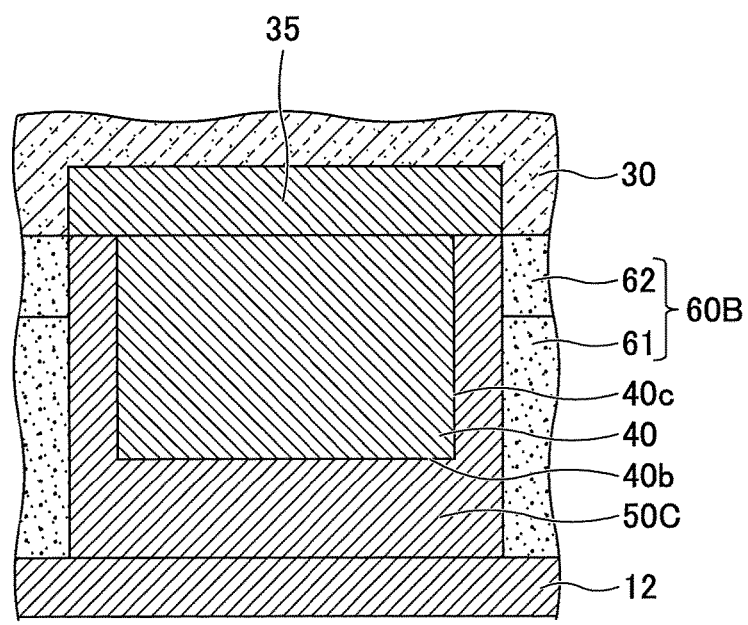

FIG. 9A is a cross-sectional view of the entirety of a semiconductor device according to the variation. FIG. 9B is an enlarged view of part A of FIG. 9A.

Referring to FIGS. 9A and 9B, a semiconductor device 1C according to the variation is different from the semiconductor device 1B (FIGS. 6A and 6B) of the second embodiment in that the conductive paste 50 is replaced with conductive paste 50C. The conductive paste 50C is formed to cover the entirety of the lower end face 40b and the entirety of the side surface 40c of each metal pillar 40 (hereinafter, "the metal pillar 40").

The amount of the conductive paste 50C filling in the openings 61x in the process depicted in FIG. 7B of the second embodiment and the amount of pressing the semiconductor chip 30 toward the first adhesive layer 61 when curing the conductive paste 50C, etc., in the process depicted in FIG. 7C of the second embodiment may be suitably controlled. By controlling the amount of filling of the conductive paste 50C and the amount of pressing the semiconductor chip 30 toward the first adhesive layer 61, part of the conductive paste 50C extends from the lower end face 40b onto the side surface 40c of the metal pillar 40 to enter the interface between the metal pillar 40 and the second adhesive layer 62. As a result, as depicted in FIGS. 9A and 9B, the conductive paste 50C can be formed to cover the entirety of the lower end face 40b and the entirety of the side surface 40c of the metal pillar 40.

Furthermore, in the process depicted in FIG. 8 of the second embodiment, the amount of printing of the conductive paste 50C on the lower end face 40b of the metal pillar 40 and the amount of pressing the semiconductor chip 30 toward the first adhesive layer 61 when curing the conductive paste 50C, etc., can be suitably controlled. By controlling the amount of printing of the conductive paste 50C and the amount of pressing the semiconductor chip 30 toward the first adhesive layer 61, part of the conductive paste 50C extends from the lower end face 40b onto the side surface 40c of the metal pillar 40 to enter the interface between the metal pillar 40 and the second adhesive layer 62. As a result, as depicted in FIGS. 9A and 9B, the conductive paste 50C can be formed to cover the entirety of the lower end face 40b and the entirety of the side surface 40c of the metal pillar 40.

The conductive paste 50C may alternatively be formed to cover the entirety of the lower end face 40b and part (a lower portion) of the side surface 40c of the metal pillar 40. That is, it is possible that part (an upper portion) of the side surface 40c of the metal pillar 40 is not covered with the conductive paste 50C to be exposed. The material of the conductive paste 50C and the thickness of the conductive paste 50C on the lower end face 40b of the metal pillar 40 may be, for example, the same as those of the conductive paste 50 of the second embodiment.

Thus, the conductive paste 50C may be formed to cover the entirety of the lower end face 40b and at least part of the side surface 40c of the metal pillar 40. As a result, the contact area of the metal pillar 40 and the conductive paste 50C increases. Therefore, it is possible to improve the connection reliability of the metal pillar 40 and the conductive paste 50C.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, according to the semiconductor devices of the above-described embodiments and their variations, a semiconductor chip is mounted on a wiring substrate including two wiring layers. Embodiments of the present invention, however, are not limited to this configuration, and a semiconductor chip may be mounted on a wiring substrate including three or more wiring layers. Furthermore, the method of manufacturing a wiring substrate on which a semiconductor chip is to be mounted is not limited to a specific method. For example, a semiconductor chip may be mounted on a wiring substrate manufactured by a build-up process, or a semiconductor chip may be mounted on wiring substrates manufactured by other processes.

Various aspects of the subject-matter described herein may be set out non-exhaustively in the following numbered clauses:

1. A method of manufacturing a semiconductor device, including:

forming a protruding electrode on a wiring layer of a wiring substrate, the wiring layer being on a surface of an insulating layer of the wiring substrate;

forming an adhesive layer over an entirety of the surface of the insulating layer, the adhesive layer covering the wiring layer and exposing an end face of the protruding electrode;

preparing a semiconductor chip including a circuit-formation surface in which an electrode pad is provided;

forming a conductive paste on the electrode pad or the end face of the protruding electrode; and curing the conductive paste and the adhesive layer while pressing the semiconductor chip against the adhesive layer, with the semiconductor chip placed on the adhesive layer so that the electrode pad contacts the protruding electrode via the conductive paste and the circuit-formation surface contacts the adhesive layer, wherein, during the curing, the adhesive layer fills in a gap between the surface of the insulating layer and the circuit-formation surface, to bond the wiring substrate and the semiconductor chip, and the adhesive layer extends onto a side surface of the semiconductor chip to form a fillet.

2. The method of clause 1, wherein the conductive paste extends from the end face of the protruding electrode onto a side surface of the protruding electrode.

3. The method of claim 2, wherein the conductive paste covers an entirety of the side surface of the protruding electrode.

4. A method of manufacturing a semiconductor device, comprising:

forming a first adhesive layer over an entirety of a surface of an insulating layer of a wiring substrate, the wiring substrate including a wiring layer on the insulating layer, the first adhesive layer covering the wiring layer;

forming an opening in the first adhesive layer, the opening selectively exposing the wiring layer;

forming a protruding electrode on an electrode pad provided in a circuit-formation surface of a semiconductor chip;

forming a second adhesive layer on the circuit-formation surface, the second adhesive layer exposing an end face of the protruding electrode;

forming a conductive paste in the opening or on the end face of the protruding electrode; and curing the conductive paste, the first adhesive layer and the second adhesive layer while pressing the semiconductor chip toward the first adhesive layer, with the semiconductor chip placed over the first adhesive layer so that the protruding electrode contacts the wiring layer at a bottom of the opening via the conductive paste and the second adhesive layer contacts the first adhesive layer, wherein, during the curing, the first adhesive layer and the second adhesive layer fill in a gap between the surface of the insulating layer and the circuit-formation surface, to bond the wiring substrate and the semiconductor chip, and the second adhesive layer extends onto a side surface of the semiconductor chip to form a fillet.

5. The method of clause 4, wherein the conductive paste extends from the end face of the protruding electrode onto a side surface of the protruding electrode.

6. The method of claim 5, wherein the conductive paste covers an entirety of the side surface of the protruding electrode.

What is claimed is:

1. A semiconductor device comprising:
   a wiring substrate including
     an insulating layer; and
     a wiring layer on a surface of the insulating layer;
   a semiconductor chip including a circuit-formation surface in which an electrode pad is provided, the semiconductor chip being mounted on the wiring substrate with the circuit-formation surface facing toward the wiring layer;
   a conductive paste electrically connecting the wiring layer and the electrode pad; and
   an adhesive layer covering an entirety of the surface of the insulating layer with a single adhesive layer, the adhesive layer covering the wiring layer and the conductive paste, the adhesive layer filling in a gap between the surface of the insulating layer and the circuit-formation surface, to bond the wiring substrate and the semiconductor chip, the adhesive layer extending onto a side surface of the semiconductor chip to form a fillet.

2. The semiconductor device as claimed in claim 1, further comprising:
   a protruding electrode formed directly on the wiring layer, the protruding electrode having an end face connected to the electrode pad via the conductive paste.

3. The semiconductor device as claimed in claim 2, wherein the conductive paste extends from the end face of the protruding electrode onto a side surface of the protruding electrode.

4. The semiconductor device as claimed in claim 3, wherein the conductive paste covers an entirety of the side surface of the protruding electrode.

5. The semiconductor device as claimed in claim 2, wherein the adhesive layer covers a side surface of the protruding electrode and a side surface of the conductive paste.

6. The semiconductor device as claimed in claim 1, further comprising:
   a protruding electrode formed directly on the electrode pad, the protruding electrode having an end face connected to the wiring layer via the conductive paste.

7. The semiconductor device as claimed in claim 6, wherein
   the adhesive layer includes
     a first adhesive layer over the entirety of the surface of the insulating layer, with a gap being formed between the first adhesive layer and the circuit-formation surface; and
     a second adhesive layer filling in the gap, the second adhesive layer extending onto the side surface of the semiconductor chip to form the fillet.

8. The semiconductor device as claimed in claim 6, wherein the conductive paste extends from the end face of the protruding electrode onto a side surface of the protruding electrode.

9. The semiconductor device as claimed in claim 8, wherein the conductive paste covers an entirety of the side surface of the protruding electrode.

10. The semiconductor device as claimed in claim 6, wherein the adhesive layer covers a side surface of the protruding electrode and a side surface of the conductive paste.

11. The semiconductor device as claimed in claim 1, wherein the conductive paste includes a resin and a metal powder dispersed in the resin.

12. The semiconductor device as claimed in claim 1, wherein the adhesive layer is formed of a same material.

13. The semiconductor device as claimed in claim 1, wherein the adhesive layer is absent on a part of the side surface of the semiconductor chip so that the part of the side surface of the semiconductor chip is exposed outside the adhesive layer.

* * * * *